United States Patent
Chang et al.

(10) Patent No.: US 8,162,592 B2
(45) Date of Patent: Apr. 24, 2012

(54) HEAT DISSIPATING MODULE

(75) Inventors: Bor-Haw Chang, Kaohsiung (TW); Chu-Hsien Chou, Kaohsiung (TW)

(73) Assignee: Asia Vital Components Co., Ltd., Taipei County (TW)

( * ) Notice: Subject to any disclaimer, the term of this patent is extended or adjusted under 35 U.S.C. 154(b) by 310 days.

(21) Appl. No.: 12/646,545

(22) Filed: Dec. 23, 2009

(65) Prior Publication Data

US 2010/0108302 A1 May 6, 2010

Related U.S. Application Data

(63) Continuation-in-part of application No. 11/356,054, filed on Feb. 17, 2006, now Pat. No. 7,670,102.

(51) Int. Cl.
*F01D 1/36* (2006.01)

(52) U.S. Cl. ............................. 415/90; 415/203; 416/4

(58) Field of Classification Search .................. 415/90, 415/203; 416/4; 361/679.48, 678, 696, 697; 454/184
See application file for complete search history.

(56) References Cited

U.S. PATENT DOCUMENTS

| | | | |
|---|---|---|---|
| 2,632,598 | A | 3/1953 | Wales, Jr. |
| 3,376,083 | A | 4/1968 | Muijderman |
| 4,157,465 | A | 6/1979 | Beardmore et al. |
| 4,380,355 | A | 4/1983 | Beardmore |
| 5,419,679 | A | 5/1995 | Gaunt et al. |
| 5,794,687 | A | 8/1998 | Webster, Jr. et al. |
| 6,166,904 | A | 12/2000 | Kitahara et al. |
| 6,196,302 | B1 | 3/2001 | Chuang |
| 6,200,035 | B1 | 3/2001 | Otsuki |
| 6,659,169 | B1 | 12/2003 | Lopatinsky et al. |
| 6,913,070 | B2 | 7/2005 | Wang et al. |

FOREIGN PATENT DOCUMENTS

JP     08195456 A1     7/1996

OTHER PUBLICATIONS

Machine Translation of JP 8195456 A, produced Aug. 11, 2009.

*Primary Examiner* — Nathaniel Wiehe

(57) ABSTRACT

A heat dissipating module includes a rotational member, a stationary member and a driving member. The rotational member is provided with a first air outlet and connected to the driving member. The stationary member is provided with a second air outlet and has plural flow passages. Each of flow passages has an air inlet at an end thereof and a third air outlet at another end thereof. When the driving member actuates the rotational member to rotate, air enters the flow passages of the stationary member via the air inlets to gather at the third outlets. Then, the air is guided outward via the first and the second air outlet for concentrating the air to cool the heat-producing object.

3 Claims, 5 Drawing Sheets

HEAT DISSIPATING MODULE

CROSS-REFERENCE TO RELATED APPLICATIONS

The present application is a Continuation-in-Part of U.S. patent application Ser. No. 11/356,054, filed on Feb. 17, 2006, titled Heat Dissipating Module, listing Bor-Haw Chang and Chu-Haien Chou as inventors, herein incorporated by reference in its entirety.

FIELD OF THE INVENTION

The present invention is related to a heat dissipating module, and more particularly to a heat dissipating module, which includes a rotational member, a stationary member and a driving member to induce air flows for cooling a heat-producing object.

BACKGROUND OF THE INVENTION

Currently, a central processing unit (CPU) is forced to dissipate heat with an axial flow fan or a centrifugal fan. As shown in FIGS. 1 and 2, a CPU 11 is attached to a radiator 13 and an axial flow fan 12 is attached to the radiator 13. The axial flow fan 12 includes a fan blade section 121 for inducing air flows. Since the heat produced by the CPU 11 is not evenly distributed over the surface thereof, the CPU 11 has a central area having a higher temperature than the rest part thereof. However, the conventional axial flow fan 12 is usually mounted directly above the CPU 11 while no air flow is produced at the center of the axial flow fan 12. As a result, the axial flow fan 12 does not allow the CPU 11 to have good heat dissipating effect.

Referring to FIGS. 3 and 4, a radiator 23 is attached to a CPU 21 and a centrifugal fan 22 is provided in a recess 231 on the radiator 23. The centrifugal fan 22 includes a fan blade section 221 for inducing air flows. Since the heat produced by the CPU 21 is not distributed evenly over the surface of the CPU 21, the CPU 21 has a central area having a higher temperature than the rest part thereof. It can be seen in FIG. 4 that the centrifugal fan 22 is usually mounted in the recess 231 directly above the CPU 21 while the air flows induced by the centrifugal fan 22 only flow toward an outer periphery of the centrifugal fan 21. Hence, the centrifugal fan 22 does not allow the CPU 21 to have good heat dissipating effect.

SUMMARY OF THE INVENTION

A primary object of the present invention is to provide a heat dissipating module structure, which includes a rotational member, a stationary member and a driving member. The stationary member has a plurality of flow passages and the rotational member induces fluid to flow into the flow passages via air inlets of the flow passages to concentrate at third air outlets of the flow passages or a first air outlet on the rotational member before the fluid is guided outward to cool a heat-producing object.

Another object of the present invention is to provide a heat dissipating module in which an uneven surface is provided on one side of the rotational member to generate air flows for cooling the heat-producing object.

A further object of the present invention is to provide a heat dissipating module, which generates air flows based on the principle of fluid viscosity.

A further object of the present invention is to provide a heat dissipating module, which is capable of gathering air flows, to cool the heat-producing object.

To achieve the above and other objects, the heat dissipating module according to the present invention includes a rotational member, a stationary member and a driving member. The rotational member is provided with a first air outlet and is coupled to the driving member. The stationary is provided with plural flow passages that are disposed opposite to one side of the rotational member. Each of the flow passages has an air inlet at an outer end thereof and a third air outlet at an inner end thereof. When the driving member actuates the rotational member to induce air flows, the air flows horizontally enter into the stationary member via the air inlets and are expelled vertically outward via the first and the second air outlets before the air flows are guided outward for concentrating the air to cool the heat-producing object.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
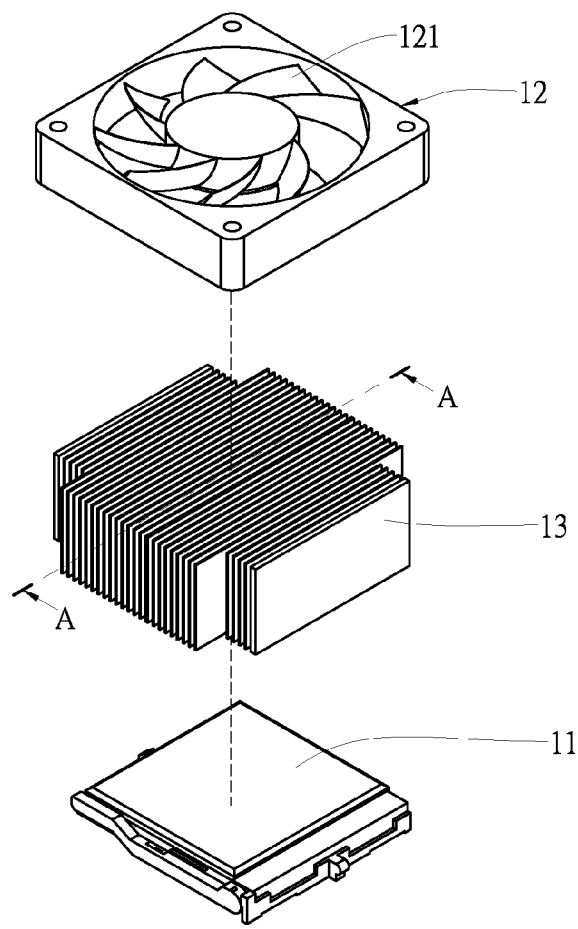
FIG. 1 is an exploded perspective view showing conventional axial flow fan.
Figure 2:
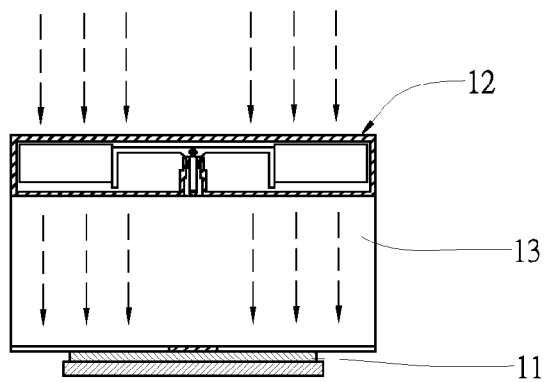
FIG. 2 is an assembled sectional view taken along line A-A of FIG. 1.
Figure 3:
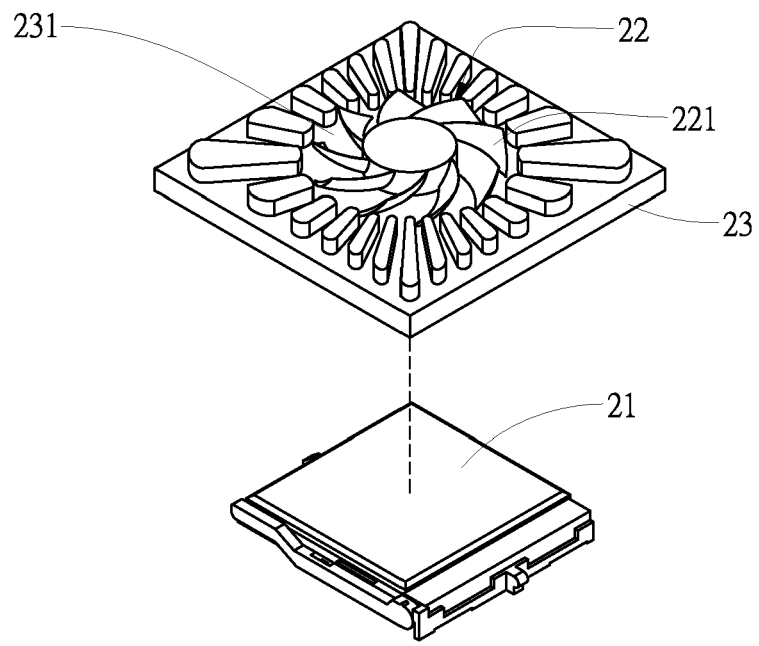
FIG. 3 is an exploded perspective view of a conventional centrifugal fan.
Figure 4:
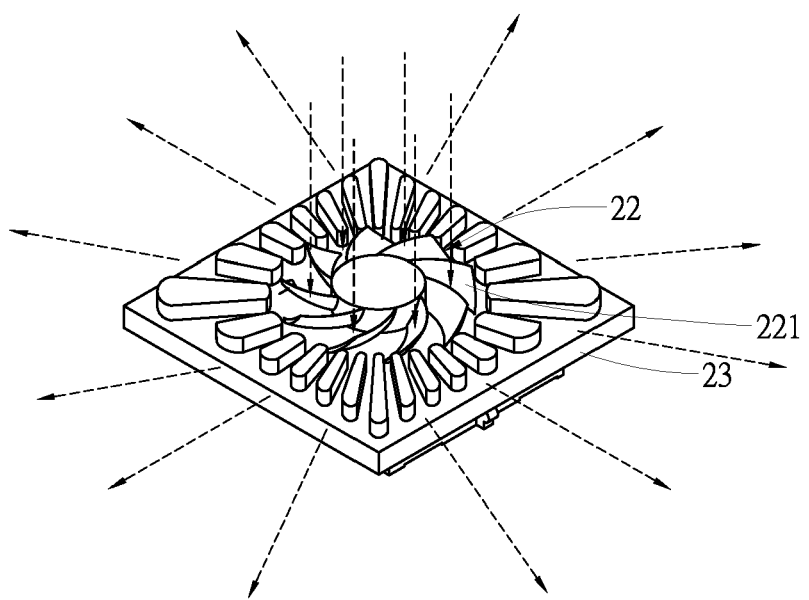
FIG. 4 is an assembled perspective view of the conventional centrifugal fan shown in FIG. 3.
Figure 5:
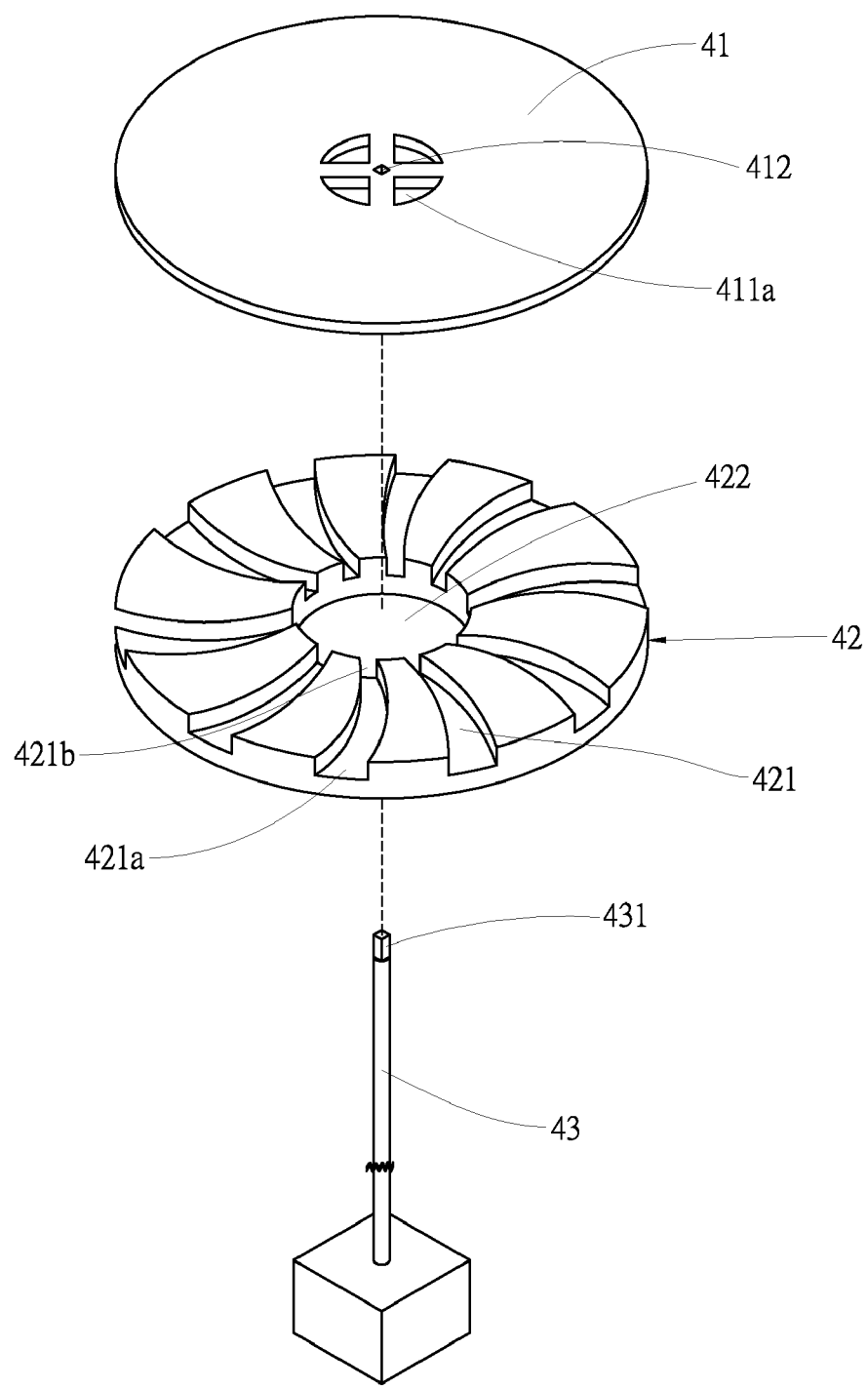
FIG. 5 is an exploded perspective view of a heat dissipating module according to a first embodiment of the present invention.
Figure 6:
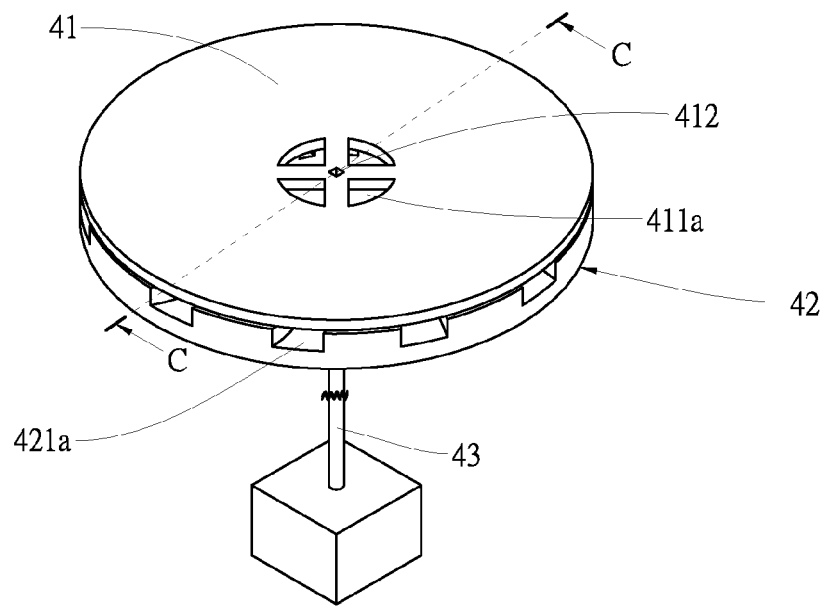
FIG. 6 is an assembled view of FIG. 5.
Figures 7, 7A:
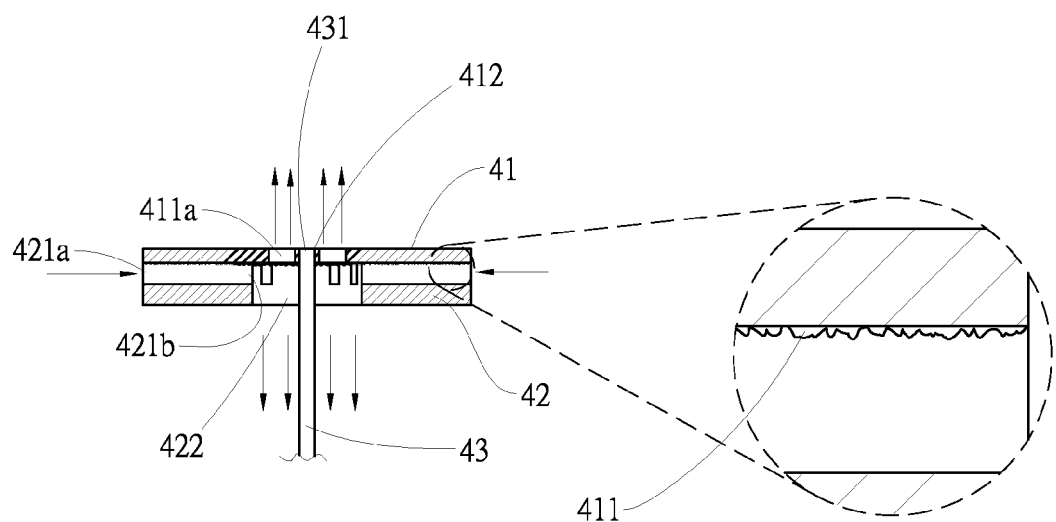
FIG. 7 is a sectional view taken along line C-C of FIG. 6.
FIG. 7A is an enlarged view of the circled area of FIG. 7 illustrating an uneven surface clearly.
Figure 8:
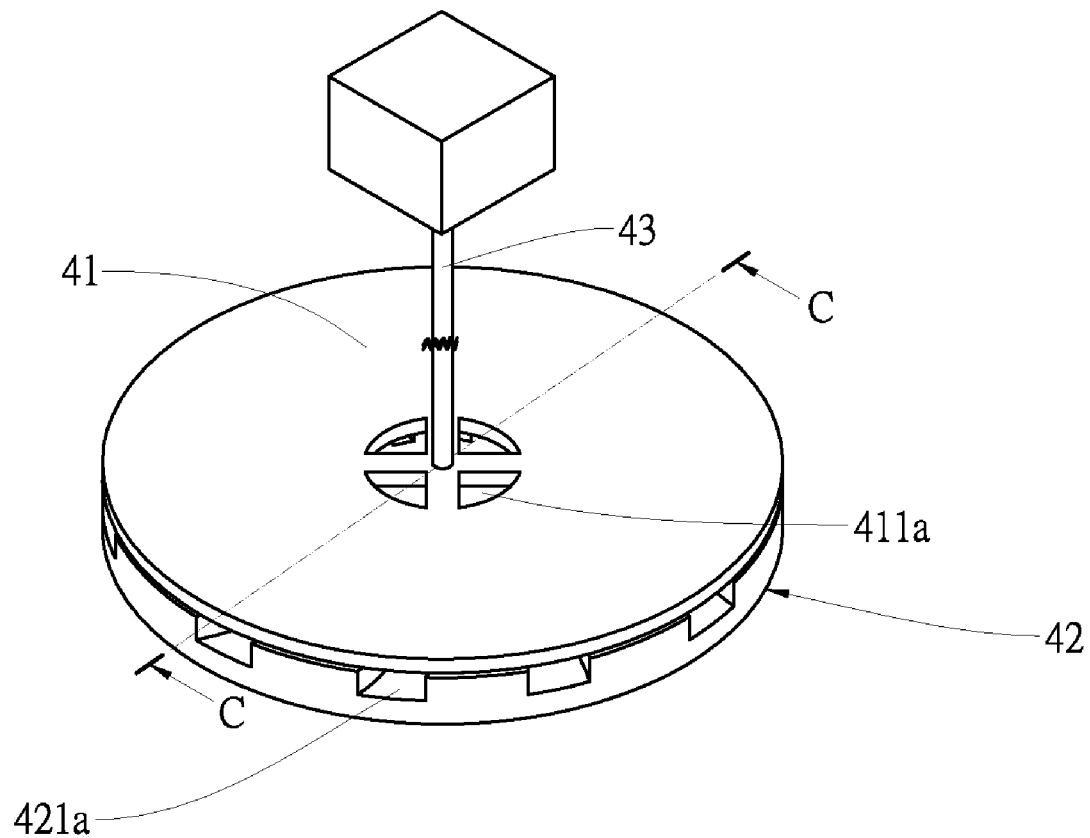
FIG. 8 is an assembled perspective view of a second embodiment of the present invention.

Please refer to FIGS. 5, 6 and 7 that show a heat dissipating module according to a first embodiment of the present invention, and to FIG. 8 that shows a heat dissipating module according to a second embodiment of the present invention. As shown, the heat dissipating module includes a rotational member 41, a stationary member 42 and a driving member 43. The rotational member 41 faces toward the stationary member 42 and is connected to the driving member 43.

The rotational member 41 is provided at a central area with a first air outlet 411a, and a receiving portion 412 is position on the first air outlet 411a. One side of the rotational member 41 facing toward the stationary member 42 is actually an uneven surface 411, as shown in FIG. 7A. That is, the rotational member 41 is substantially planar with an uneven surface.

The stationary member 42 is provided with a second air outlet 422 corresponding to the first air outlet 411a. One side of the stationary member 42 facing toward the uneven surface 411 is provided with a plurality of flow passages 421. Each of the flow passages 421 has an air inlet 421*a* formed at an outer end thereof, and a third air outlet 421*b* formed at an inner end thereof.

The air inlets 421*a* are located on an outer peripheral surface of the stationary member 42, and the third air outlets 421*b* communicate with the second air outlet 422. More specifically, the air inlets 421*a* communicate with the first air outlet 412, the second air Outlet 422 and the third air outlets 421*b* via the flow passages 421.

The driving member 43 includes a connecting portion 431 coupled to the receiving portion 412, and a space is formed between the rotational member 41 and the stationary member 42. As shown in FIGS. 5 and 7, in the first embodiment of the present invention, the connecting portion 431 of the driving member 43 is extended through the second air outlet 422 from the side with the stationary member 42 to couple to the receiving portion 412 of the rotational member 41. Alternatively, as in the second embodiment of the present invention shown in FIG. 8, the driving member 43 can be coupled with the receiving portion 412 from the side with the rotational member 41.

As can be seen in FIG. 7, when the driving member 43 brings the rotational member 91 to rotate, air flows are horizontally sucked into the flow passages 421 via the air inlets 421*a*. The air flows in the flow passages 421 pass through the third air outlets 421*b* and are vertically expelled outward via the first air outlet 411*a* and the second air outlet 42. Therefore, external air surrounding the stationary member 42 can arrive and be concentrated in the heat dissipating module and then forced out of the heat dissipating module via the first and the second air outlets 411*a* and 422, respectively. By aligning the first and the second air outlets 411*a* and 422 with the heat-producing object, heat produced by the heat-producing object can be effectively dissipated.

Further, since one side of the rotational member 41 facing toward the stationary member 42 is an uneven surface 411, an increased fluid viscosity between the rotational member 41 and the stationary member 42 can be achieved to thereby increase the air amount being sucked into the heat dissipating module.

The present invention has been described with some preferred embodiments thereof and it is understood that many changes and modifications in the described embodiments, such as changes in the configuration or the arrangements of the components thereof, can be carried out without departing from the scope and the spirit of the invention that is intended to be limited only by the appended claims.

What is claimed is:

1. A heat dissipating module, comprising:
   a rotational member provided with a first air outlet, the rotational member being substantially planar with an uneven surface, wherein the first air outlet is disposed at a center of the rotational member;
   a stationary member provided with a second air outlet, the stationary member being disposed to one side of the rotational member, the stationary member being provided with a plurality of flow passages located beneath the rotational member, and each of the flow passages having an air inlet at an outer end thereof and a third air outlet at an inner end thereof;
   the air inlets being located on an outer peripheral surface of the stationary member and communicating with the first air outlet, the second air outlet and the third air outlets; and
   a driving member connected to the rotational member from either a side with the stationary member or a side with the rotational member.

2. The heat dissipating module as defined in claim 1, wherein a space is provided between the rotational member and the stationary member.

3. The heat dissipating module as defined in claim 1, wherein the rotational member further includes a receiving portion being positioned on the first air outlet, and the driving member has a connecting portion coupled to the receiving portion.

* * * * *